United States Patent [19]

Anvari

[11] Patent Number: 5,485,120
[45] Date of Patent: Jan. 16, 1996

[54] FEED-FORWARD POWER AMPLIFIER SYSTEM WITH ADAPTIVE CONTROL AND CONTROL METHOD

[75] Inventor: Kiomars Anvari, Walnut Creek, Calif.

[73] Assignee: Aval Communications Inc., Walnut Creek, Calif.

[21] Appl. No.: 282,132

[22] Filed: Jul. 28, 1994

[51] Int. Cl.⁶ .................. H03F 1/32; H03P 3/66
[52] U.S. Cl. .................. 330/151; 330/52; 330/149
[58] Field of Search .................. 330/52, 107, 109, 330/149, 151

[56] References Cited

U.S. PATENT DOCUMENTS

| | | | |
|---|---|---|---|
| 3,922,617 | 11/1975 | Denniston | 330/149 |
| 4,412,185 | 10/1983 | Gerard | 330/149 |
| 5,157,345 | 10/1992 | Kenington et al. | 330/151 X |

*Primary Examiner*—Steven Mottola
*Attorney, Agent, or Firm*—Townsend and Townsend and Crew; Kenneth R. Allen

[57] ABSTRACT

An adaptive control system and method for use with a feed-forward linear amplifier, and in particular a multi-channel linear amplifier wherein a distortion (error) detection circuit is used for detecting a nonlinear distortion component of a main amplifier output for using in correcting distortion in amplifying an information signal. The distortion correction can be extracted from a pilot signal, an analysis of distortion from a channel-by-channel sweep or from analysis of selected target channels. Analysis can be based on a single signal, an average of many signals, or a selection of maxima of one or many signals. Subharmonic sampling may be used in analog to digital conversion of an IF signal to detect for distortion within a passband.

29 Claims, 15 Drawing Sheets

$F_N$ = FIRST FREQUENCY OF THE WANTED FREQUENCY BAND
$F_M$ = LAST FREQUENCY OF THE WANTED FREQUENCY BAND

FEED-FORWARD POWER AMPLIFIER SYSTEM WITH ADAPTIVE CONTROL AND CONTROL METHOD

BACKGROUND OF THE INVENTION

The present invention relates to radio frequency (RF) power amplifiers and methods for minimizing distortion by employing adaptive control circuitry, particularly in feed forward power amplifiers, and the application of such control circuitry in wireless telecommunication systems, especially multi-carrier amplifiers.

Amplifiers are used to amplify an electrical signal in voltage, current or power. Amplifying devices are typically not perfectly linear over the whole of their operating ranges, and the nonlinearities in their transfer characteristics introduce distortion at the output of the amplifier.

Class "A" and "AB" amplifiers at best produce −30 to −35 dBc third order intermodulation (IM3) distortion unless they are operated significantly below maximum power. To do so to achieve a desired power level requires a very high power amplifier which is not always a viable solution. A well-known and established linearization technique is the use of feed-forward circuitry with the amplifier. However, the potential problem with standard feed-forward circuits is in the design of the distortion (error) amplifier and the fact that for a class-A or class-AB main amplifier, at least 25 to 30 dB of further cancellation is required to achieve −60 dBc IM3. The implication is that an amplitude error of less than 0.5 dB and a phase error of less than one degree must be achieved for proper operation of the system. Although the amplifier system can initially be set to meet these performance specifications, it is widely believed, as a result of component aging, environmental conditions, and other factors which introduce drift, such systems are dynamic and will inevitably fail to sustain required performance levels.

One potential solution is to create a feedback loop based on a dynamic vector modulator which can be added to the amplifier assembly with a feed-forward linearizer. The dynamic vector modulator might be controlled through a microprocessor or DSP-based controller. A high level block diagram of such a feed-forward amplifier with an adaptive controller is shown in FIG. 2.

U.S. Pat. No. 3,922,617, issued Nov. 25, 1975 to Denniston, discloses a feed-forward amplifier system as shown in FIG. 3 in this system, a sample of the input signal is subtractively combined with a sample of the output signal to produce a sample of the distortion products. The distortion sample is adjusted in phase and amplitude and subtractively combined with the device output to produce a distortion-reduced system output. First and second pilot signals, applied to the input of the feed-forward amplifier and the output of the main amplifier respectively, are detected in the sample of distortion product and the system output in order to produce control signals which adjust the phase and amplitude of the input signal and the distortion signal to provide an system which automatically compensates for uncontrolled variations caused by system components and operating environment.

The Denniston system requires a coherent detection network for the injected pilot signals to provide the correct control signal for phase and amplitude adjustment. Coherent detection adds inherent complexity to the system and makes implementation significantly difficult, especially for multi-carrier systems.

U.S. Pat. No. 4,412,185, issued Oct. 25, 1983 to Gerard, describes another feed-forward amplifier system as shown in FIG. 4. Referring to the numbered regions of the figure, the signals from 8 and 5 are subtracted at 7 to provide a distortion signal amplified and inverted at 10 which is combined at 11 with amplified signal 26. A reference signal 13 is injected at main amplifier 2 into the in-band frequency, such that it appears at the output terminal as if an amplified-induced distortion. Monitor circuit 14 monitors reference signal 13, present at output terminal 3, and modifies the characteristics of phase and amplitude equalizer 15, so as to remove injected reference signal 13 from amplified output signal at point 3.

As with the Denniston system, the reference (pilot) signal used is either a single tone, which is adjusted successively to a desired reference frequency, or employs a comb of frequencies like those typically generated by a comb generator. Where a single reference signal is employed, it must be monitored and employed to repeatedly adjust the appropriate frequency band of the equalizer for each successive reference frequency in order to perform a cancellation. Where a comb of frequencies is used, monitoring must be frequency selective, and therefore it must adjust and respond to each particular comb frequency while the appropriate band of the equalizer is adjusted.

While this patent teaches a system that attempts to achieve intermodulation product cancellation over a wide range of frequency bands, it nonetheless suffers from the shortcoming that several equalizer band adjustments must be performed before a desired degree of distortion cancellation is achieved. The tire required to perform these successive corrections adversely impacts system distortion cancellation and performance.

The prior art teaches the down-conversion of RF signals to DC, prior to sampling and digital processing, thus resulting in the introduction of spurious noise and so-called "DC offset." These imperfections, though not problematic for many applications, can seriously degrade system performance when introduced into the digital domain, especially in cases where the control of system components is sensitive to minor changes in sampled and processed RF signals.

What is needed is a distortion minimization system for feed-forward amplifiers, including multi-carrier feed-forward amplifiers, which rapidly and with precision, maintains a close dynamic balance between delay and amplification branches of both main and distortion (error) amplifier loops, thus maximizing distortion cancellation in a multitude of conditions. Furthermore, such systems must be easy to implement, economical, and not introduce undue complexity.

SUMMARY OF THE INVENTION

According to the invention, an adaptive control system and method for use with a feed-forward linear amplifier, and in particular a multi-channel linear amplifier, wherein a distortion (error) detection circuit is used for detecting a nonlinear distortion component of a main amplifier output for use in correcting distortion in amplification of an information signal. The distortion correction can be extracted from a pilot signal, an analysis of distortion from a channel-by-channel sweep or from analysis of selected target channels. Analysis can be based on a single signal, an average of many signals, or a selection of maxima of one or many signals. Subharmonic sampling may be used in analog to digital conversion of an IF signal to detect for distortion within a passband.

In a particular embodiment, an amplifier circuit receives an input signal having at least one carrier therein in a specified frequency band, includes a feed-forward circuit with a distortion (error) detection circuit for detecting a nonlinear distortion component of a main amplifier output and a distortion (error) rejection circuit for amplifying a detected distortion signal by a distortion (error) amplifier, which detected distortion signal is injected into the output of the main amplifier to cancel and thus eliminate the distortion components.

In a specific embodiment the distortion (error) detection circuit is controlled by a phase and gain equalizer which could comprise, for example, a phase shifter and variable attenuator. The equalizer is operationally positioned at the input of the main amplifier. The control signals for the equalizer are provided by detecting the position of the input carrier signals using samples of the main amplifier output, and minimizing their amplitude at the output of the distortion (error) detector.

The distortion (error) cancellation circuit is controlled by a similar phase and gain equalizer in the distortion (error) amplifier path. The control signals for the equalizer can be provided by one or a combination of the following:

1. Injecting in-band or out-of-band pilot signals at known frequencies and measuring their amplitude at the output of the main amplifier in order to generate a control signal.

2. Using a fast frequency synthesizer to scan the in-band and out-of-band in channel steps, differentiate the distortion (error) products from the desired modulated carriers, measure their amplitude at the output of the feed-forward amplifier, and produce the control signals to minimize them.

3. Locating the frequency of the in-band modulated carrier signals, use this information to determine the location of the distortion (error) products, measure their amplitude at the output of the feed-forward amplifier, and produce the control signals to minimize them.

Samples from main amplifier output and distortion (error) amplifier inputs are first processed in a two-stage down-conversion process which converts the RF signals to filtered intermediate frequency (IF) signals. These IF signals are then converted directly to the digital domain, without conversion to DC. Digital signal processing yields the equalizer control signals. Sample signals may also be averaged and used to generate equalizer control signals.

The present invention also provides a means for automatically calibrating amplifier systems at the time of manufacture and/or periodically thereafter, in order that the systems compensate for changes in overall operating tolerances and characteristics.

The present invention also includes means for generating an alarm signal which shuts down the amplifier system in the event of a significant system control imbalance.

Because of the speed and accuracy with which the present invention can maintain feed-forward amplifier systems in balance and thus virtually distortion-free, it is particularly well-suited for implementation with multi-carrier systems. The invention provides an opportunity for significantly down-sizing and consolidating amplification equipment commonly used in mobile cellular, micro-cellular, personal communication systems and networks (PCS and PCN), fixed wireless, and special mobile radio (SMR) systems.

The invention will be better understood upon reference to the following detailed description in connection with the following drawings.

DESCRIPTION OF SPECIFIC EMBODIMENTS

AMPLIFICATION SYSTEM USING INJECTED PILOT SIGNALS

In one preferred embodiment of the invention, a feed-forward amplifier system using a pilot signal injected into the main amplifier loop is coupled with an adaptive control system. The pilot signal is generally used by the adaptive controller to calculate the control signal for the equalizer in the distortion (error) amplifier path. The pilot signal may also be used to calculate the control signals for the equalizer in the main amplifier path. If the pilot signal is not used for this latter purpose, in-band signals at the output of the coupler between the amplifier and delay branches of the main amplifier path are detected and used to calculate the control signals for the main amplifier path equalizer.

A. Feed-forward Amplifier

Figure 1:
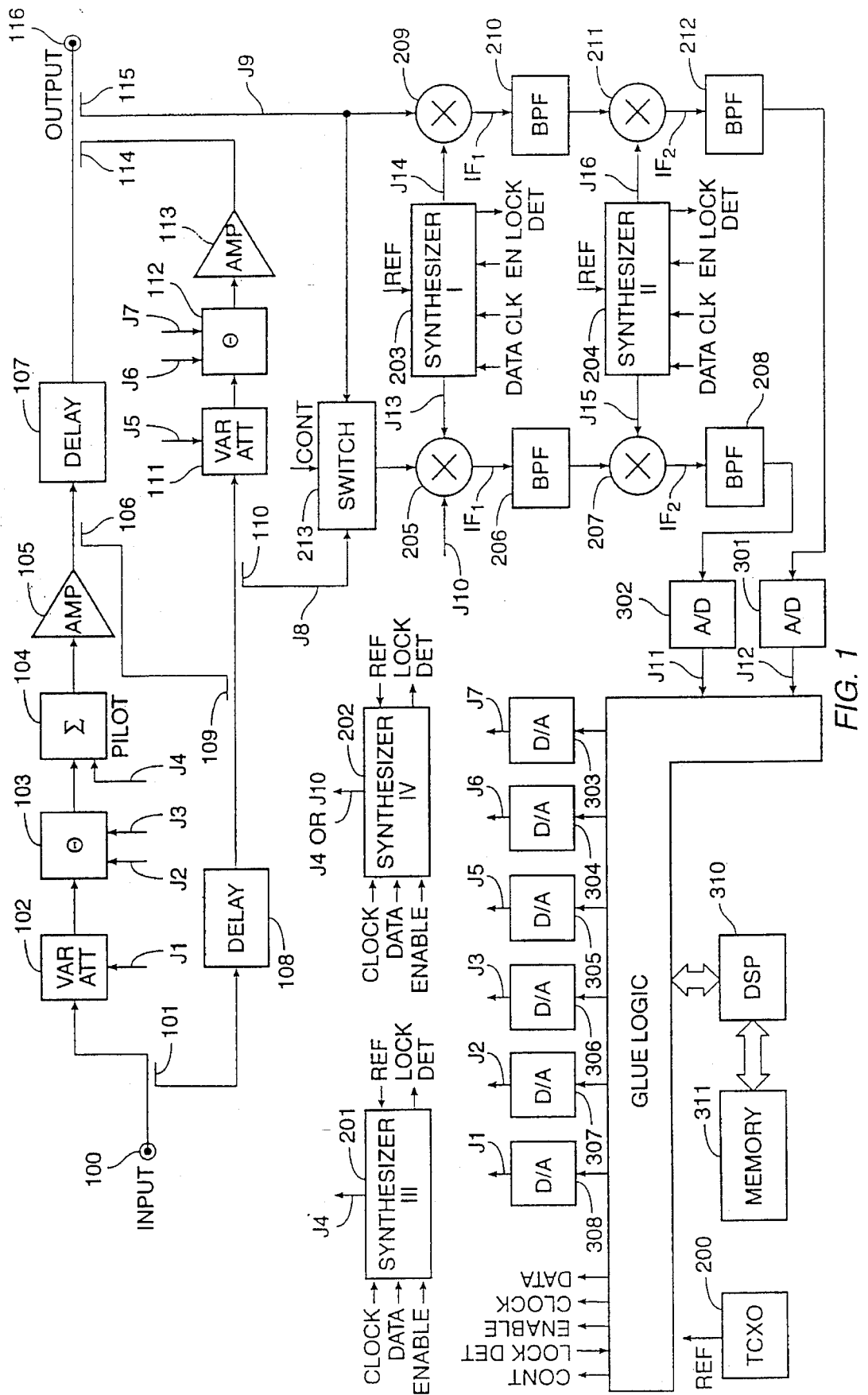
FIG. 1 is a feed-forward amplifier system with adaptive controller relying upon an injected pilot signal according to the invention.
Figure 2:
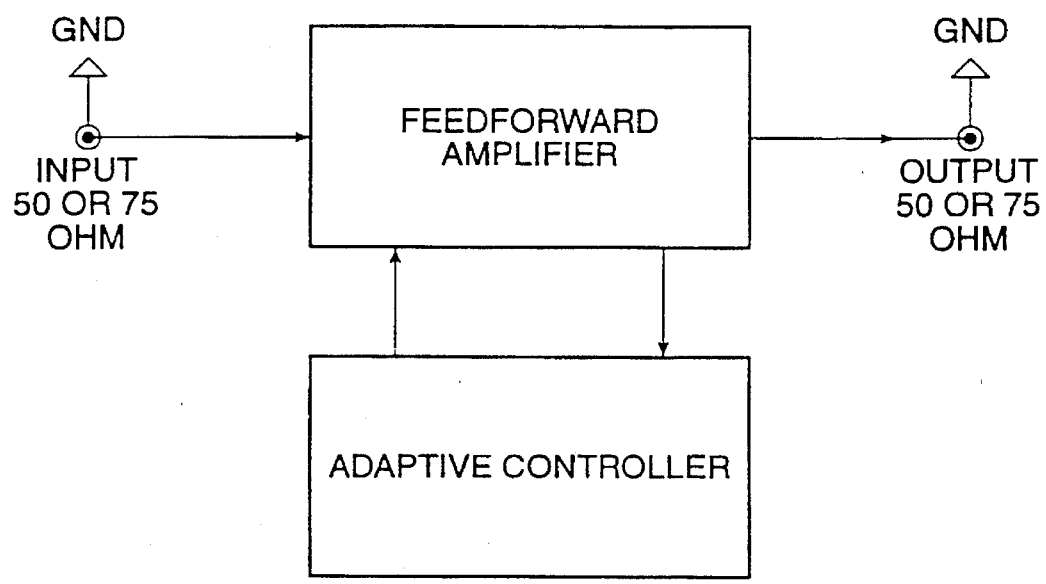
FIG. 2 is a block diagram of a feed-forward amplifier with an adaptive controller of the prior art.
Figure 3:
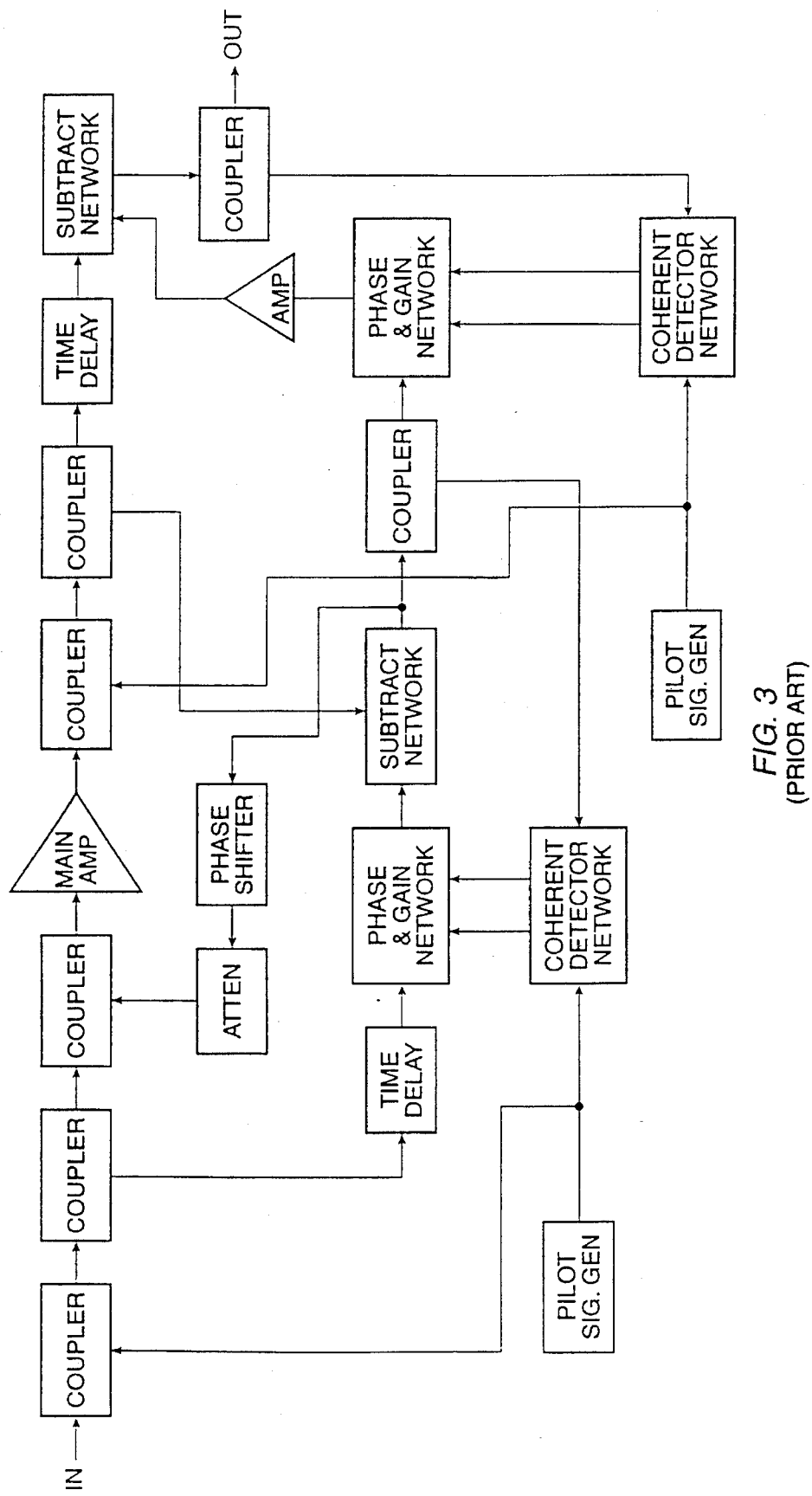
FIG. 3 is a block diagram of a feed-forward amplifier system with injected pilot signal of the prior art.
Figure 4:
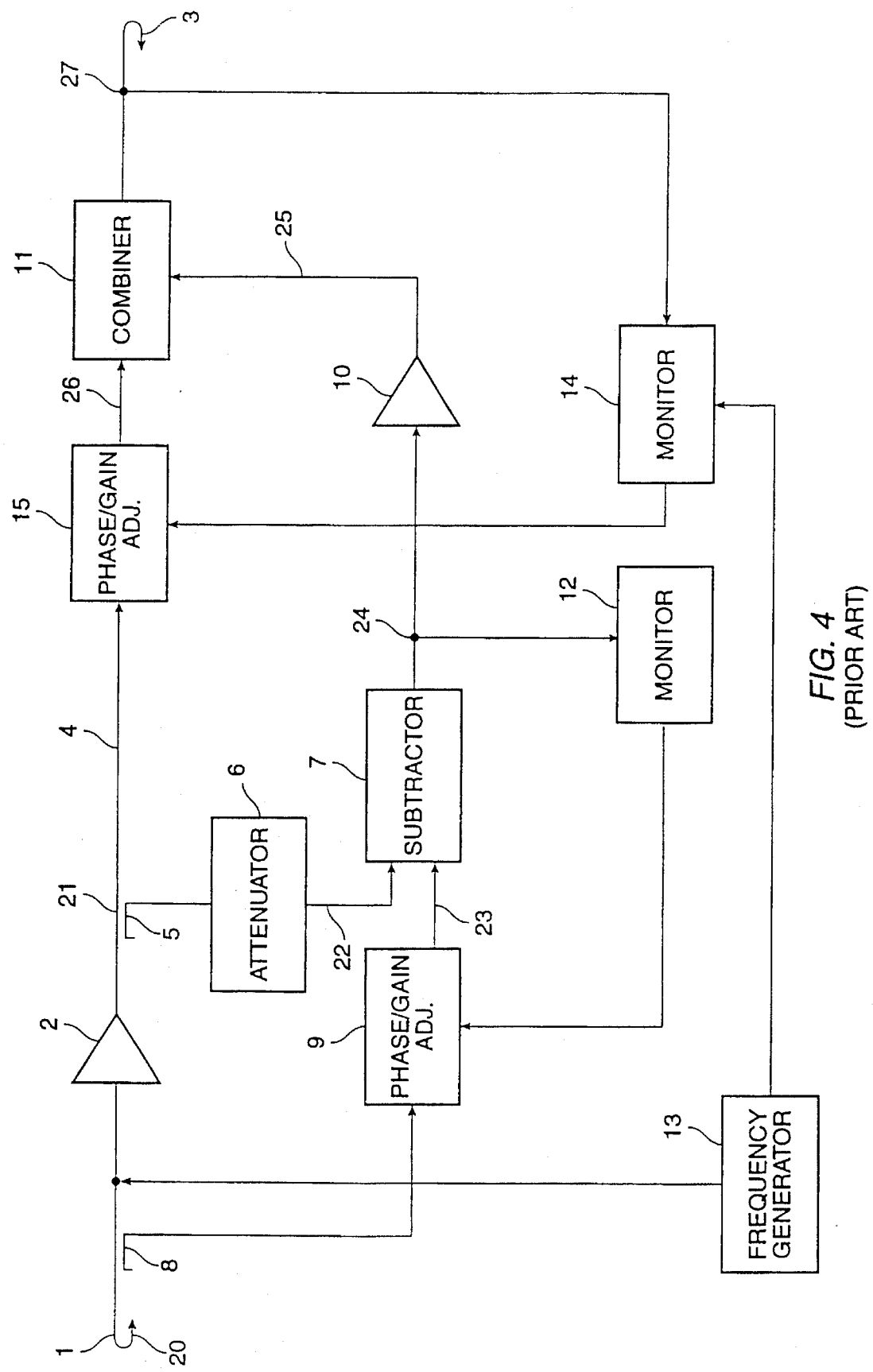
FIG. 4 is a feed-forward amplifier system from the prior art.
Figure 5:
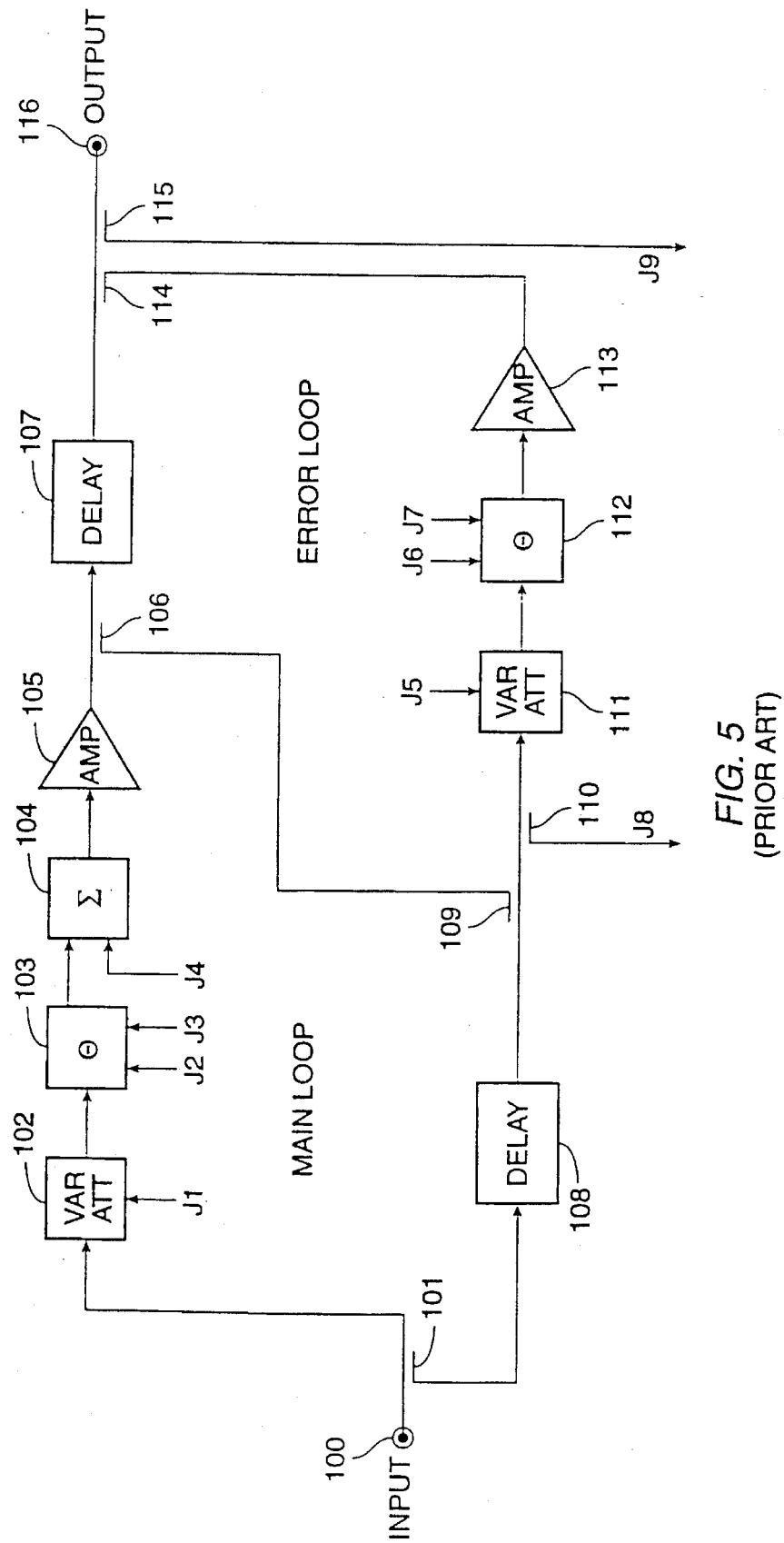
FIG. 5 is a prior art feed-forward amplifier system used in a preferred embodiment of the present invention.

FIG. 1 shows an amplifier system consisting of a feed-forward amplifier and an adaptive controller system according to the invention. The structure of the feed-forward amplifier is known in the art. It is shown in FIG. 5 in detail with 50 Ohm or 75 Ohm input and output impedances. The remainder of FIG. 1 shows the adaptive controller system according to the invention.

The prior art feed-forward amplifier as shown in FIG. 5 consists of two amplifier loops. The first amplifier loop consists of a main amplifier 105, a phase shifter 103, an attenuator 102, a signal combiner 104, and a delay line 108. An input signal 100 is applied to a coupler 101. The first output of coupler 101 is amplitude adjusted by attenuator 102 and then phase adjusted by phase shifter 103. The phase and gain adjusted signal is then combined in signal combiner 104 with a pilot signal injected through port J4. The resulting signal is amplified to the desired level by main amplifier 105. The output of main amplifier 105 consists of both the desired signal, the unwanted distortion, and the pilot signal.

Main amplifier 105 output is applied to coupler 106 where a sample of the output is taken. This sample signal is applied to distortion (error) detector coupler 109. The second input of coupler 109 is the output of coupler 101 delayed by delay line 108.

If the propagation delay balance between the branch containing main amplifier 105 and the delay line branch with delay line 108 is perfect, the output of distortion (error) detector coupler 109 will be only the distortion introduced by main amplifier 105. However, when this condition does not exist, the adaptive controller according to the present invention will adjust attenuator 102 and phase shifter 103 to make the output of distortion (error) detector coupler 109 as close as possible to the distortion signal. The output of coupler 109 is the scaled distortion signal produced by main amplifier 105 and will be used to minimize distortion in the output of the feed-forward amplifier by using the distortion (error) loop.

A pilot signal injected at J4 into combiner 104 may be an out-of-band signal and is only used by the adaptive controller for adjustment purposes, i.e., to construct an error signal for use in controlling phase and attenuation of one of the paths in the feedforward amplifier. Typically, the pilot signal is cancelled along with the distortion so the pilot signal does not propagate as part of the information signal at the output.

The distortion (error) signal from distortion (error) detector coupler 109 (a subtractor) is sampled by continuous sampler 110. The sample signal (via J8) is then sent to the adaptive controller for processing.

The second amplifier loop consists of distortion amplifier 113, phase shifter 112, attenuator 111, and delay line 108. The output of delay 108 combined with the continuously sampled output of amplifier 105 is first applied to attenuator 111 and then phase shifter 112 for gain and phase adjustment. A small continuously-sampled signal is taken at 110 and sent to the controller via J8. The amplitude and phase adjusted distortion (error) signal is amplified by distortion (error) amplifier 113 before being applied to the distortion (error) cancellation coupler 114 (effectively a subtractor). The second input of distortion cancellation coupler 114 is the delayed (by delay line 107) output of main amplifier 105. Delay line 107 is used to provide equal propagation delay along both signal paths of main amplifier 105 and distortion amplifier 113.

If the attenuators, phase shifters, and delay lines in both main loop and the distortion (error) loop provide synchronous propagation delay between the two branches of each path, the output 116 will contain negligible distortion.

The output of distortion cancellation coupler 114 is sampled by sampler 115 before reaching output port 116. The sample signal (J9) is sent to the adaptive controller for processing.

B. Adaptive Controller

The adaptive controller comprises three sub-units. They are:

1. RF sub-unit
2. Digital hardware sub-unit
3. Adaptive controller algorithm

FIG. 1 shows the adaptive controller according to the invention.

1. RF sub-unit

The RF sub-unit is shown in FIG. 1. It provides an interface between the digital processing domain and the feed-forward amplifier. It also provides the reference clock for the digital hardware and the pilot signal generator for injection at combiner 104 in the feed-forward amplifier. Frequency synthesizer (SYN) 201 produces the RF pilot signal and injects it into the feed-forward amplifier at combiner 104 through J4. TCXO 200 provides the reference (Ref) frequency for synthesizers 201, 202, 203, and 204. The other inputs of synthesizer 201 are clock (CLK), data (Data), and latch enable (EN) signals. Synthesizer 201 also provides a lock detect (Lock Det) output signal which indicates if synthesizer 201 is out of lock. Synthesizer 202 has similar inputs (CLK, Data, Ref, EN) and outputs (RF and Lock Det). The RF output of synthesizer 202 may be used as a second pilot signal for the feed-forward amplifier through combiner 104 at J4. Alternatively, when output J10 is used for mixer 205 it acts as a local oscillator (LO).

The output of mixer 205 is down-converted to a first intermediate frequency (IF1) by the first LO signal from synthesizer 202 through J10 or the first LO signal from synthesizer 203 through J13. The IF1 signal is then filtered by Band Pass Filter (BPF) 206 and then further down-converted to a second intermediate frequency (IF2) by mixer 207 using the second LO signal from synthesizer 204 through J15. The IF2 signal is filtered by BPF 208 and applied to J11 of the digital hardware sub-unit.

The signal from J9 is applied to mixer 209 where it is down-converted in frequency to IF1, equal to a frequency from mixer 209 using the first LO from synthesizer 203 through J14. This IF1 signal is filtered by BPF 210 and then further down-converted to a IF2 signal by mixer 211. The LO for mixer 211 is provided by synthesizer 204 through J16. The IF2 signal is filtered by BPF 212 and applied to J12 of the digital hardware sub-unit.

It should be noted that, under certain circumstances, the signal conversions from IF1 to IF2 in the various embodiments of the present invention may not be necessary. In such cases, the IF1 signal is sent directly to its respective A/D converter. The two-step down-conversion from IF1 to IF2 signals is preferred where the maximum reduction in unwanted signals is necessary.

Synthesizer 203 provides the LO for both mixer 205 and mixer 209. Synthesizer 203 is similar to synthesizer 201 and synthesizer 202 in that it has CLK, Data, Ref, and EN inputs and RF and Lock Det signal outputs. The second LO which is used by mixer 207 and mixer 211 is provided by synthesizer 204. Synthesizer 204 has inputs (CLK, Data, Ref, and EN) and outputs (RF, Lock Der), similar to synthesizer 203.

2. Digital hardware sub-unit

The adaptive controller digital hardware sub-unit is shown in FIG. 1. The digital hardware sub-unit consists of analog to digital (A/D) converters 301 and 302, digital to analog (D/A) converters 303, 304, 305, 306, 307, and 308, conventional interface logic, also known as glue logic 309, digital signal processor (DSP) 310, and memory 311. The two IF2 signals (or IF1 signals, if only a single-stage down-conversion from RF to IF is used) from the RF sub-unit (from J12 and J11) are converted to digital signals by A/D converter 301 and A/D converter 302, respectively. Digital control signals produced by DSP 310 for phase shifters 103 and 112 and attenuators 102 and 111 are converted to analog signals by D/A converters 303, 304, 305, 306, 307, and 308 before being applied to the feed-forward amplifier through J7, J6, J5, J3, J2, J1, respectively.

"Glue logic" 309 provides the interface from DSP 310 to A/D converters 301 and 302 and D/A converters 303, 304, 305, 306, 307, and 308. Glue logic 309 also serves as the interface for the programming for synthesizers 201, 202, 203, and 204.

DSP 310 executes the adaptive controller algorithm and produces the feed-forward amplifier control signals for phase shifters 103 and 112 and attenuators 102 and 111. The input to DSP 310 includes the digitally converted IF2 (or IF1) signals from the RF sub-unit via A/D converters 301 and 302 and glue logic 309. DSP 310 also performs the programming for synthesizers 201, 202, 203, and 204.

Memory 311 stores the program which contains the adaptive controller algorithm for use by DSP 310.

3. Adaptive Controller Algorithm

Figure 6A:
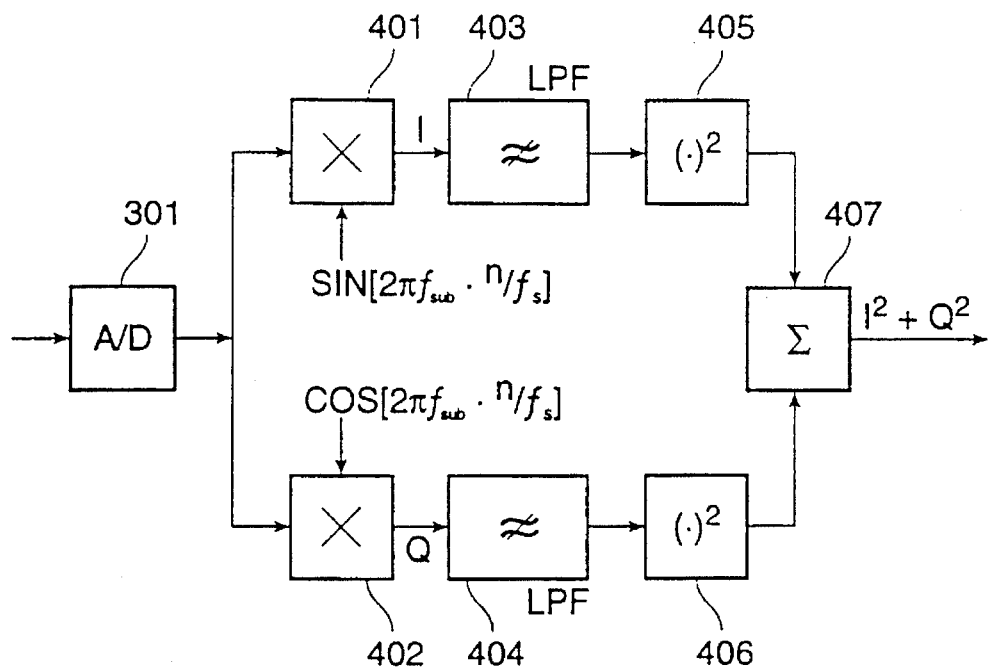
FIGS. 6a and 6b are block diagrams of baseband down-conversion system.

The adaptive controller algorithm which will be executed by DSP 310 comprises three functions. They are:

a. Baseband down-conversion b. Estimation c. Correction a Baseband down-conversion FIG. 6 illustrates the baseband down-conversion of signals from the A/D converters 301 and 302 from IF2 (or IF1) signals to baseband (F). The sampled signal from A/D converter 301 in FIG. 61a (through J12) is down-converted to an in-phase (I) baseband signal by mixer 401 and to a quadrature phase (Q) base band signal by mixer 402. These constitute the first inputs into mixers 401 and 402. The second input into mixer 401 is:

$\sin [2\pi f_{sub} \cdot n/f_s]$ and the second input into mixer 402 is:

$\cos [2\pi f_{sub} \cdot n/f_s]$, where:

n=an integer number $f_s$=sampling frequency of the A/D converter 301

$f_{sub}$=center frequency of one of the sub-harmonics of the sampled signal.

The I baseband signal is low pass filtered by LPF 403 and squared by 405 to produce $I^2$. Similarly, the Q baseband signal is low pass filtered by LPF 404 and squared by 406 to produce $Q^2$. $I^2$ and $Q^2$ are summed at 407 to produce $I^2+Q^2$, the square root of which is the signal amplitude.

Figure 6B:
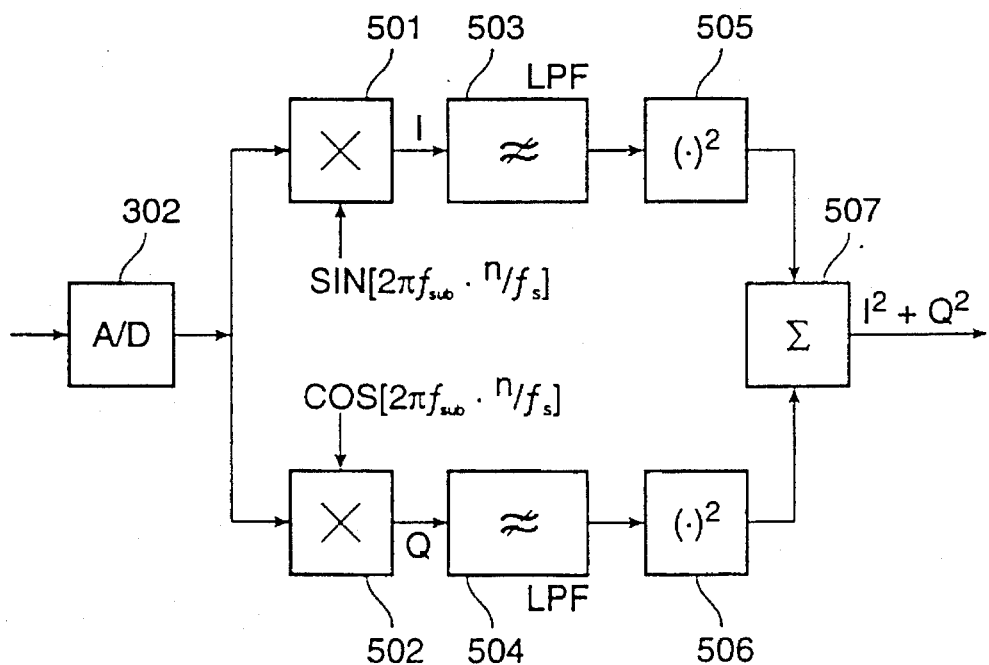

As shown in FIG. 6b, the output of the A/D converter 302 will undergo a similar process. The sampled signal from of A/D converter 302 (through J11) is down-converted to in phase (I) baseband signal by mixer 501 and to quadrature phase (Q) baseband signal by mixer 502. These constitute the first inputs into mixers 501 and 502. The second input into mixer 501 is $\sin [2\pi f_{sub} \cdot n/f_s]$ and the second input into mixer 502 is $\cos [2\pi f_{sub} \cdot n/f_s]$.

where:

n=an integer number $f_s$=sampling frequency of the A/D converter 302

$f_{sub}$=center frequency of one of the sub-harmonics of the sampled signal.

The I baseband signal is lowpass filtered by LPF 503 and squared by 505 to produce $I^2$. Similarly the Q baseband signal is lowpass filtered by LPF 504 and squared by 506 to produce $Q^2$. $I^2$ and $Q^2$ are summed at 507 to produce $I^2+Q^2$, the square root of which is the signal amplitude. Signal amplitudes are used by the estimation function (described below) to process the adaptation algorithms.

Figure 7A:
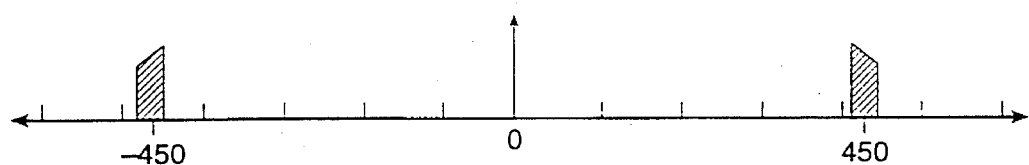
FIG. 7 is a spectral diagram example of IF sampling.
Figure 7B:
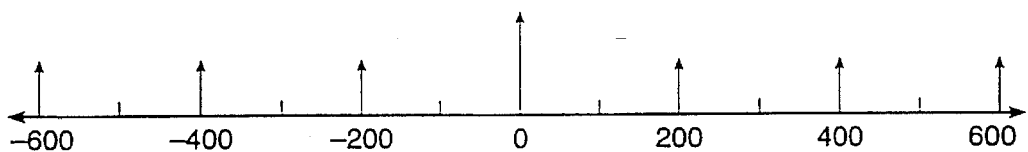
Figure 7C:
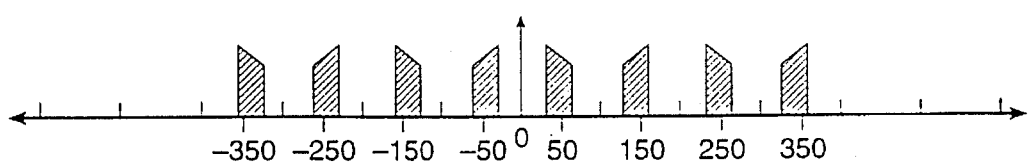

The sampling frequency ($f_s$) for both A/D converters 301 and 302 can optionally be made identical and should be a minimum of about four times greater than the IF2 (or IF1) signal bandwidth. FIG. 7 shows an example of IF sampling where IF frequency=450 kHz, IF bandwidth=25 kHz and $f_s$=200 kHz (eight times greater than IF signal bandwidth).

Significantly, this method of sub-harmonic sampling uses very low sampling frequencies and can be made highly specific to the frequency band sampled, meaning few, if any, spurious signals enter the digital processing domain where they may adversely affect accurate control signal generation. In addition, IF sampling eliminates errors and signal processing problems introduced by DC offset. IF sampling also provides a means to measure both amplitude and phase of the sampled signals.

b. Estimation and correction

The estimation function consists of two algorithms executed by DSP 310. The results of these algorithms are employed by a search algorithm which issues equalizer control signals for correcting nonlinearities in the amplification system. These algorithms are:

i. An adaptation algorithm to cancel the in-band, wanted signal at the output of coupler 109.

ii. An adaptation algorithm to cancel the distortion at the output of coupler 114.

These two algorithms have their separate control parameters and perform independently. It is possible, however, to use the sample signal at sampler 115 (referring to FIG. 1) at the output of the amplifier to control both the main amplifier loop and distortion (error) amplifier loop.

i. Adaptation algorithm to cancel the in-band, wanted signal

The in-band wanted signal at the output of coupler 109 has to be canceled out and only the distortion produced by main loop amplifier 105 should appear at this point. In order to guarantee that output of coupler 109 is only the distortion produced by main loop amplifier 105, the two branches (amplifier and delay) of the main amplifier 105 loop have to be balanced. These two branches can become out of balance due to aging of components and circuits, changes in load, and a range of environmental factors, including increased temperatures. To keep the main amplifier 105 loop branches balanced, variable attenuator 102 and phase shifter 103 are used. The control signals used to adjust attenuator 102 and phase shifter 103 are supplied by the adaptive controller. It should be noted the variable attenuator and phase shifter can be positioned in either the amplifier branch or the delay branch.

In order to produce the control signals for attenuator 102 and phase shifter 103, the output of coupler 109 must be monitored. This is accomplished by coupler 110 which takes a sample of the output of coupler 109 and sends it through J8 to the controller RF sub-unit. There, it is down-converted to an IF2 (or only IF1) signal. The IF2 (or IF1) signal is then sent to the digital hardware sub-unit through J11, where it is sampled by A/D converter 302 and then down-converted to baseband for the amplitude calculation.

Figure 8:
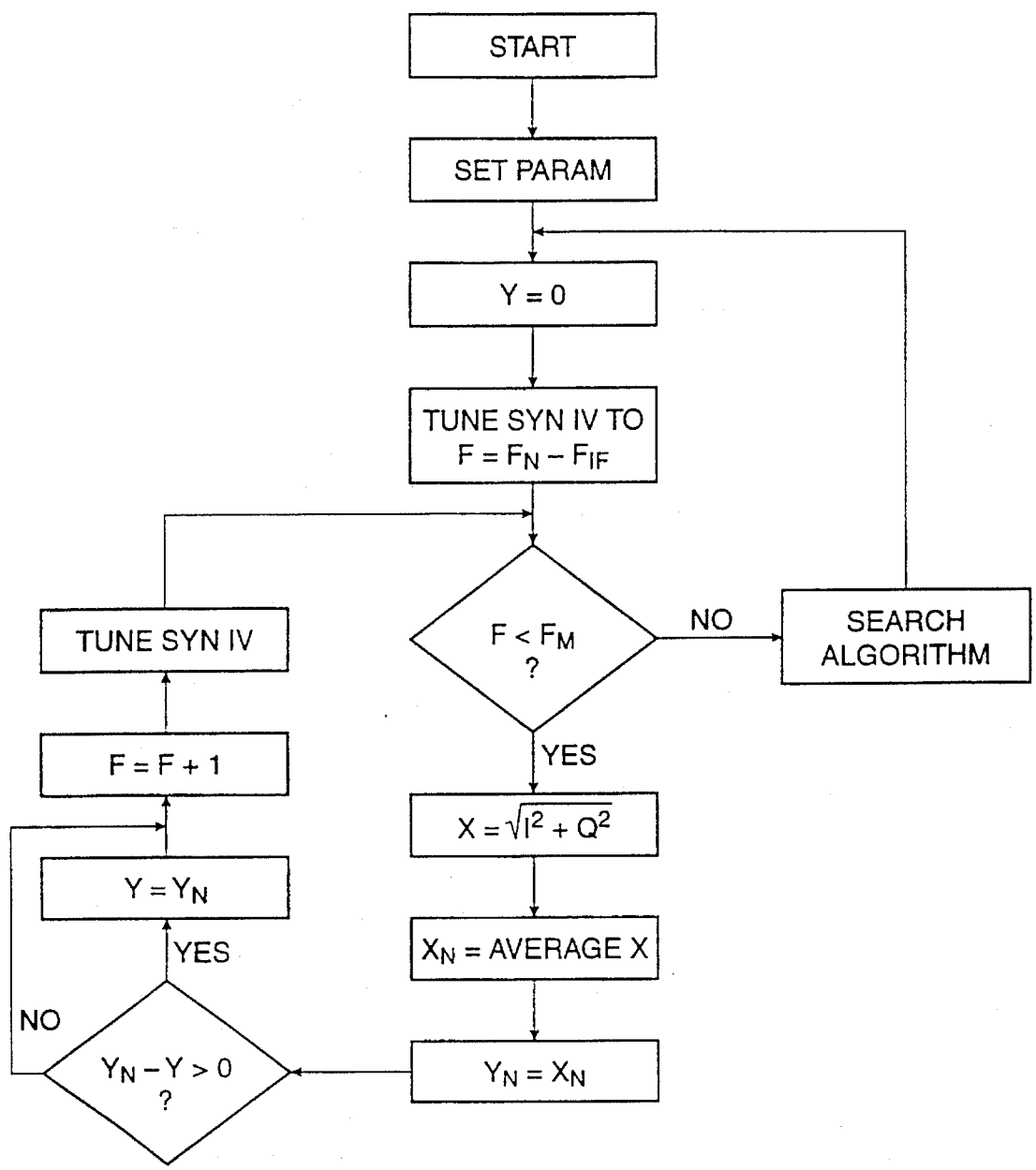
FIG. 8 is a flow chart of an adaptation algorithm used to produce maximum in-band, wanted signal cancellation, based on sampling highest amplitude wanted signal.

This process is carried out on a channel by channel basis in the in-band signal. The channels are selected by synthesizers 203 or 202 in the adaptive controller RF sub-unit. BPF 206 and BPF 208 limit the signal to channel bandwidth. The signal amplitude (square root of $I^2+Q^2$) for each individual channel is applied to the adaptation algorithm shown in the flow chart of FIG. 8 in order to cancel the in-band, wanted signal. This algorithm calculates the individual, in-band channel signal amplitude for a specified set of parameters (which are the phase of phase shifter 103 and the amplitude of attenuator 102), finds the largest value, and sends it to the search algorithm for evaluation. The search algorithm may be of a type well-known in the art which specifies the value of the above parameters for each round of measurement. The search algorithm finds the control signal values for attenuator 102 and phase shifter 103, applies them, and holds them until the wanted channel signal at the output of coupler 109 exceeds a specified criterion. At that point, the search algorithm starts searching for new values for attenuator 102 and phase shifter 103 by following the process described above.

Preferably, the search algorithm first calculates the best value for phase shifter 103 and causes its adjustment. The search algorithm then calculates the best value for attenuator 102, leading to creation of the control signals affecting its adjustment.

ii. Adaptation algorithm to cancel the unwanted, distortion signal

The unwanted distortion at the output of coupler 114 must be canceled out and only amplified input signal 100 should appear at this point. In order to guarantee that output of coupler 114 is only amplified input signal 100, without distortion or with only negligible distortion, the two branches (delay and error amplifier) of the distortion (error) amplifier 113 loop must be balanced. These two branches can become out of balance due to aging of components and circuits, changes in load, and a range of environmental factors, including increased temperatures. To keep the distortion (error) amplifier 113 loop branches balanced, variable attenuator 111 and phase shifter 112 are used. The control signals used to adjust attenuator 111 and phase shifter 112 are supplied by the adaptive controller.

In order to produce the control signals for attenuator 111 and phase shifter 112, the output of coupler 114 must be monitored. This is accomplished by coupler 115 which takes a sample of the output of coupler 114 and sends it through J9 to the controller RF sub-unit. There, it is down-converted to an IF2 (or IF1) signal. The IF2 (or IF1) signal is then sent to the digital hardware sub-unit through J12, where it is sampled by A/D converter 301 and then down-converted to baseband for the amplitude calculation.

In this embodiment of the invention, this process is accomplished using an out-of-band pilot tone, which may optionally be swept across the desired bands. Synthesizer 201 produces an out-of-band pilot signal and applies it to the main amplifier 105 loop at combiner 104 at J4. The pilot signal is transferred to the RF sub-unit via J9. The signal from J9 is applied to mixer 209 where it is down-converted in frequency to IF1. This IF1 signal is filtered by BPF 210 and then further down-converted to a IF2 signal by mixer 211. The LO for mixer 211 is provided by synthesizer 204 through J16. The IF2 signal is filtered by BPF 212 and applied to J12 of the digital hardware sub-unit. BPF 210 and BPF 212 limit the signal to out-of-band pilot signals.

Figure 10:
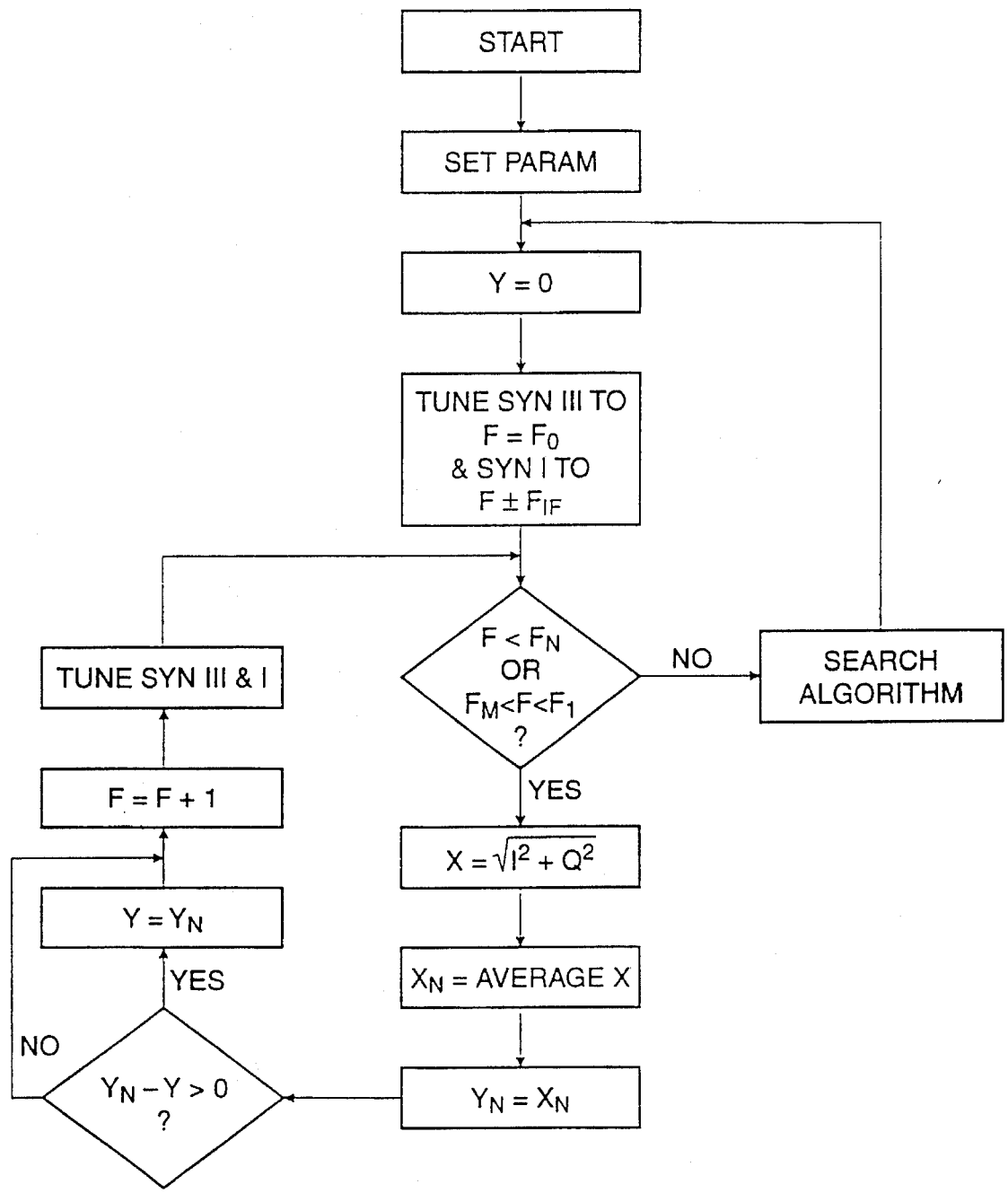
FIG. 10 is a flow chart of an adaptation algorithm used to produce maximum out-of-band, unwanted signal cancellation, based on sampling highest amplitude injected pilot signal.

The signal amplitude (square root of $I^2+Q^2$) for each of the individual pilot signals is then applied to the adaptation algorithm shown in FIG. 10 in order to cancel the unwanted, distortion signal. This algorithm calculates, for a specified set of parameters (the phase of phase shifter 112 and amplitude of attenuator 111), the amplitude of the individual pilot signals, finds the largest value and sends it to a search algorithm for evaluation.

The search algorithm specifies the value of the above parameters for each round of measurement. The search algorithm finds the values for attenuator 111 and phase shifter 112 which produce the best balance in the amplifier and delay branches of the distortion (error) amplifier 113 loop. The search algorithm applies these values to attenuator 111 and phase shifter 112 and holds them until the changes in the amplitude of the pilot signals at the output of coupler 114 exceeds a specified criterion. At this point, the search algorithm starts searching for new values for attenuator 111 and phase shifter 112, using the process described above.

Preferably, the search algorithm first calculates the best value for phase shifter 112 and then calculates the best value for attenuator 111.

AMPLIFICATION SYSTEM USING CHANNEL BY CHANNEL SAMPLING

In another preferred embodiment of the invention a feed-forward amplifier system of a type known in the art (or of a type as disclosed herein) is coupled with an adaptive controller system. The adaptive controller maintains the propagation delay balance between the signal path through the main amplifier and the signal path through the distortion (error) amplifier loops without the use of an injected pilot signal. Instead, a channel-by-channel search is made of the distortion signals, with the desired channels being selected by a synthesizer. This system makes use of the same RF sub-unit as in the embodiment described above to down-convert RF signals to IF for more rapid and accurate digital signal processing and for calculating the necessary control signals to dynamically maintain distortion-free amplifier output.

A. Feed-forward Amplifier

The design and operation of the feed-forward amplifier system in this embodiment is the same as for the previous embodiment, except that, referring to FIG. 1, combiner 104 is removed and no pilot signal is generated by synthesizer 201 or synthesizer 202 and injected at J4. This embodiment of the invention is where an amplifier system, without an injected pilot signal, consists of a feed-forward amplifier and an adaptive controller system. The output of amplifier 105 consists of both the desired signal and the unwanted distortion.

The distortion (error) signal from distortion (error) detector 109 is sampled by sampler 110. The sample signal (J8) is then sent to the adaptive controller for processing.

The output of distortion cancellation coupler 114 is sampled by sampler 115 before reaching output port 116. The sample signal (J9) is sent to the adaptive controller for processing.

B. Adaptive Controller

In this particular embodiment, the adaptive controller comprises the same three sub-units as in the embodiment described above, namely RF sub-unit, digital hardware sub-unit, and adaptive controller algorithm. The adaptive controller algorithm, however, contains the following changes to the adaptation algorithm used to cancel the distortion at the output of coupler 114.

The unwanted distortion at the output of coupler 114 must be canceled out and only amplified input signal 100 should appear at this point. In order to guarantee that output of coupler 114 is only amplified input signal 100, without distortion, the two branches (delay and error amplifier) of the distortion (error) amplifier 113 loop must be balanced. These two branches can become out of balance due to aging of components and circuits, changes in load, and a range of environmental factors, including increased temperatures. To keep the distortion (error) amplifier 113 loop branches balanced, variable attenuator 111 and phase shifter 112 are used. The control signals used to adjust attenuator 111 and phase shifter 112 are supplied by the adaptive controller.

In order to produce the control signals for attenuator 111 and phase shifter 112, the output of coupler 114 must be monitored. This is accomplished by coupler 115 which takes a sample of the output of coupler 114 and sends it through J9 to the controller RF sub-unit. There, it is down-converted to an IF2 signal. The IF2 signal is then sent to the digital hardware sub-unit through J12, where it is sampled by A/D converter 301 and then down-converted to baseband for the amplitude calculation.

In this particular embodiment of the invention, this process is accomplished on a channel by channel basis. The channels are selected by synthesizer 203 for the channel by channel calculation of the distortion signals in J9. Synthesizer 203 and mixer 209, followed by synthesizer 204 and mixer 211, down-convert the distortion signals to an IF2 signal. BPF 210 and 212 limit the distortion signal to channel band widths. The signal amplitude (square root of $I^2+Q^2$) for each of the individual distortion signals is applied to the adaptation algorithm, shown in FIG. 10, in order to cancel the unwanted distortion signal. This algorithm calculates, for a specified set of parameters (phase of phase shifter 112 and amplitude of attenuator 111, the amplitude of the individual out-of-band channels, finds the largest value and sends it to the search algorithm for evaluation.

The search algorithm specifies the value of the above parameters for each round of measurement. The search algorithm finds the values for attenuator 111 and phase shifter 112 which produce the best balance in the amplifier and delay branches of the distortion (error) amplifier 113 loop. The search algorithm applies these values to attenuator 111 and phase shifter 112 and holds them until the changes in the amplitude of the distortion signals at the output of coupler 114 exceeds a specified criterion. At this point, the search algorithm starts searching for new values for attenuator 111 and phase shifter 112, using the process described above.

As in previously described embodiments, the search algorithm first calculates the best value for phase shifter 112 and then calculates the best value for attenuator 111.

AMPLIFICATION SYSTEM USING TARGETED CHANNEL SAMPLING

In yet another preferred embodiment of the invention, a feed-forward amplifier system of a type well-known in the art or of the type disclosed herein is coupled with an adaptive controller system. The adaptive controller maintains the balance between the delay and amplifier branches of the main amplifier and distortion (error) amplifier loops without the use of an injected pilot signal and without sampling on a channel by channel basis. Instead, by identifying the position (frequency) of desired, in-band carriers, the distortion (error) signals associated with desired carriers can then be located and measured. This information is then used to calculate the necessary control signals to dynamically maintain distortion-free amplifier output.

A. Feed-forward Amplifier

Referring to FIG. 1, the design and operation of the feed-forward amplifier system in this embodiment is essentially the same as for the previous embodiment.

B. Adaptive Controller

In this particular embodiment, the adaptive controller comprises the same three sub-units as in the embodiment described above, namely the RF sub-unit, the digital hardware sub-unit, and an adaptive controller algorithm. However, as shown in FIG. 1, signals from J8 and J9 are applied to switch (SW) 213 which chooses one of the signals J8 or J9 before applying it to mixer 205. Switch 213 is controlled by a control signal from glue logic 309, produced from an algorithm executed in DSP 310.

Since the strength of the desired, in-band signals is larger at J9 than at J8, the signal at J9 is preferably used to locate the frequency of the desired carriers. Note the process of detecting the frequency of desired carrier signals can be performed in parallel with minimizing the distortion at output 116 by using switch 213.

When switch 213 is switched to J9, the RF sub-unit path from mixer 209, through BPF 210 and mixer 211, to BPF 212 is used to collect and sample signals used to generate control signals which will minimize distortion. At the same time, RF sub-unit path from mixer 205, through BPF 206 and mixer 207, to BPF 208 is used to locate the frequency of desired carrier signals.

When switch 213 is switched to J8, coupler 110 is sampled for wanted signals at the output of 109, the measurement of which are used to produce the control signals which alter attenuator 102 and phase shifter 103, and thus maintaining distortion-free amplifier output.

ALTERNATIVE SAMPLE SIGNAL MANIPULATIONS

In another embodiment of the present invention, rather than using discrete sample signals in the process of generating equalizer control signals, sets of signals can be averaged to produce the values for control signal derivation.

Figure 9:
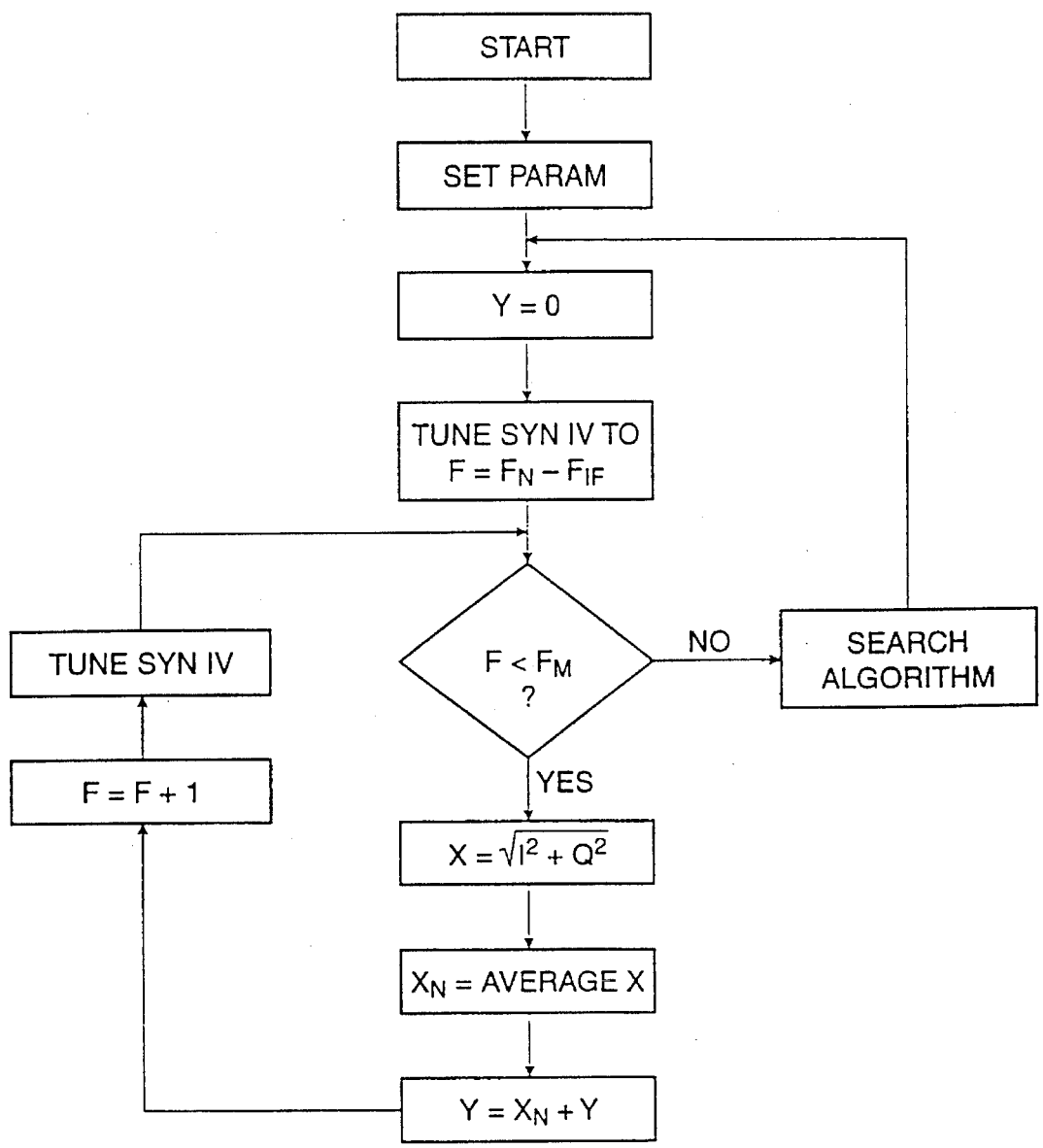
FIG. 9 is a flow chart of an adaptation algorithm used to produce maximum in-band, wanted signal cancellation, based on an average of wanted sample signal amplitudes.

In FIG. 9, maximum in-band wanted signal cancellation is achieved by tuning synthesizer 202 to all channels in a wanted frequency band ($F_N$ to $F_M$). At each frequency (or channel), the average value of the signal amplitude ($X_N$) is calculated. Note "X" is the magnitude of each sample from A/D converter 302 (FIG. 1). Then, all values for $X_N$ are averaged to produce $Y_N$. The value $Y_N$ is then used by the search algorithm where the search algorithm will attempt to minimize $Y_N$ by adjusting the parameters of phase shifter 103 and attenuator 102 (FIG. 1) in accordance with the present invention.

Figure 11:
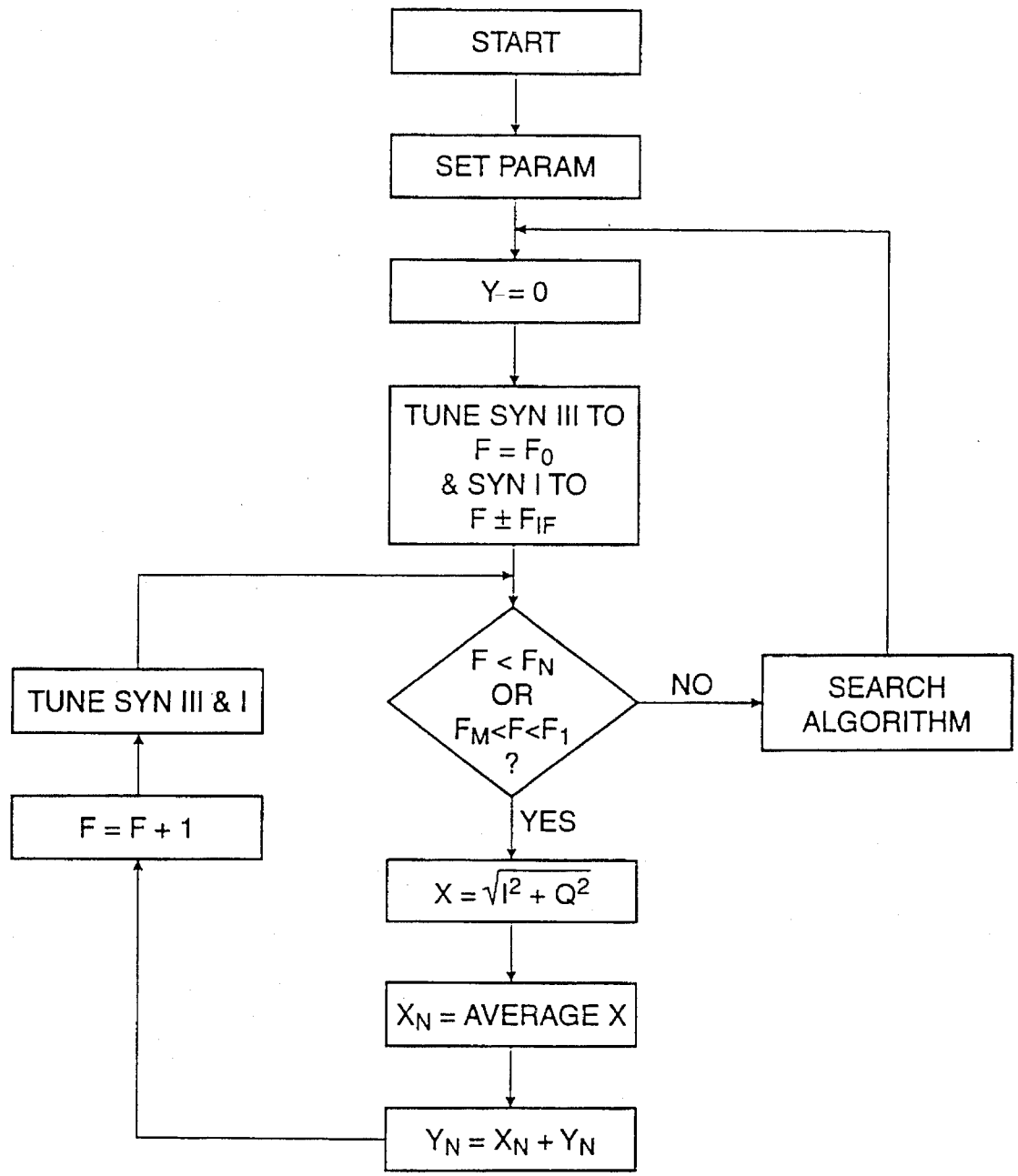
FIG. 11 is a flow chart of an adaptation algorithm used to produce maximum out-of-band, unwanted signal cancellation based on an average of pilot signal amplitudes.

In FIG. 11, maximum in-band and out-of-band unwanted signal cancellation is produced by tuning synthesizer 201 to produce a series of in-band or out-of-band pilot signals. The signal path between J9 and J12 is used to detect these pilot signals at output 116 (FIG. 1). The amplitude of each different pilot frequency thus detected is measured by averaging the magnitude of the samples from A/D converter 301 to produce $X_N$. The value of $X_N$ for various pilots are average to produce $Y_N$. The value $Y_N$ is then used by the search algorithm where the search algorithm will attempt to minimize $Y_N$ by adjusting the parameters of phase shifter 112 and attenuator 111 in accordance with the present invention.

Figure 12:
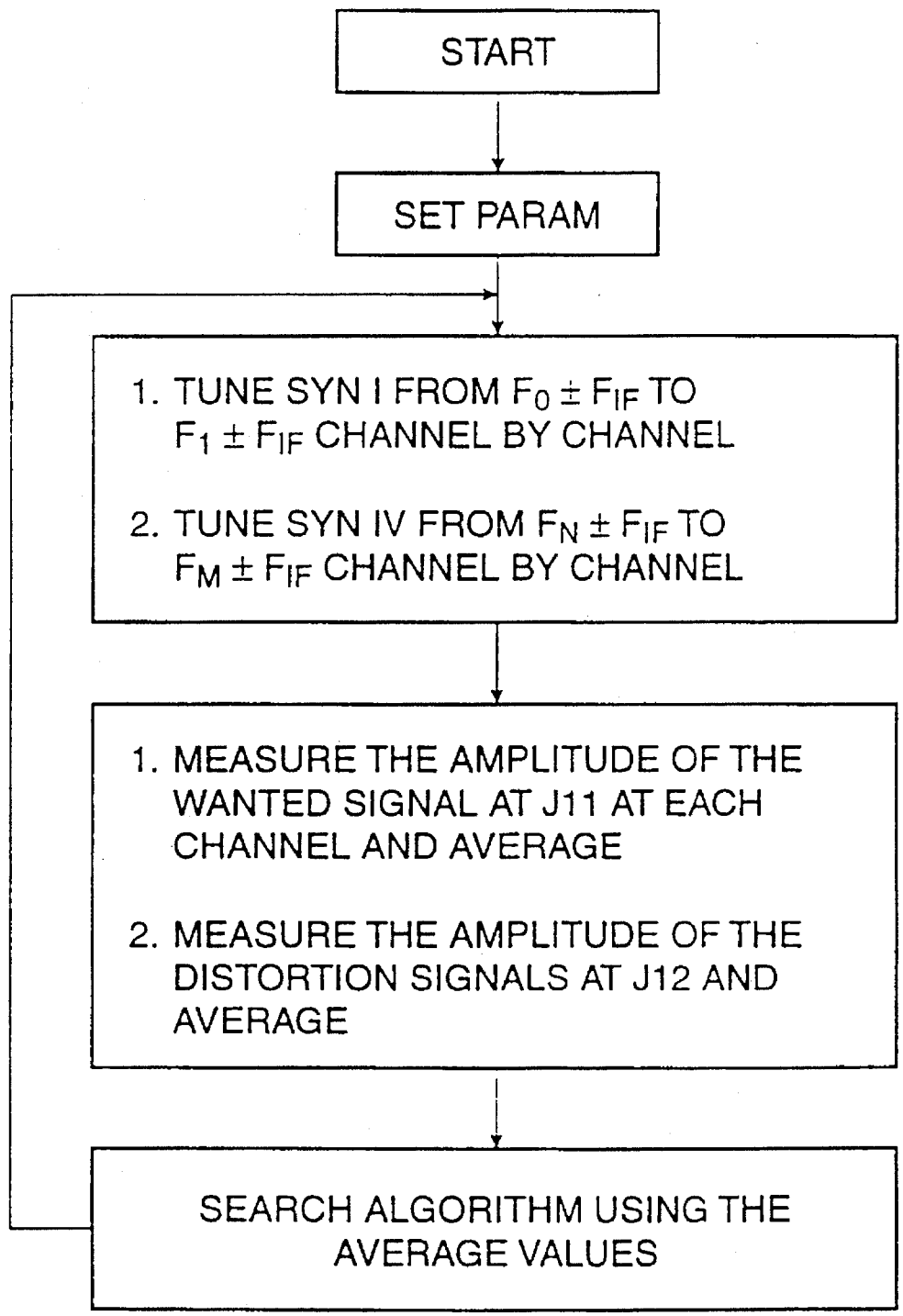
FIG. 12 is a flow chart of an algorithm used to produce an averaged sample signal value using a channel-by-channel sampling method.

Rather than locating and measuring the sample signals with the highest amplitude and using these values to calculate equalizer control signals, FIG. 12 shows how the amplitudes of distortion and wanted signals can be averaged and these averages used by a search algorithm to provide the control signals.

Figure 13:
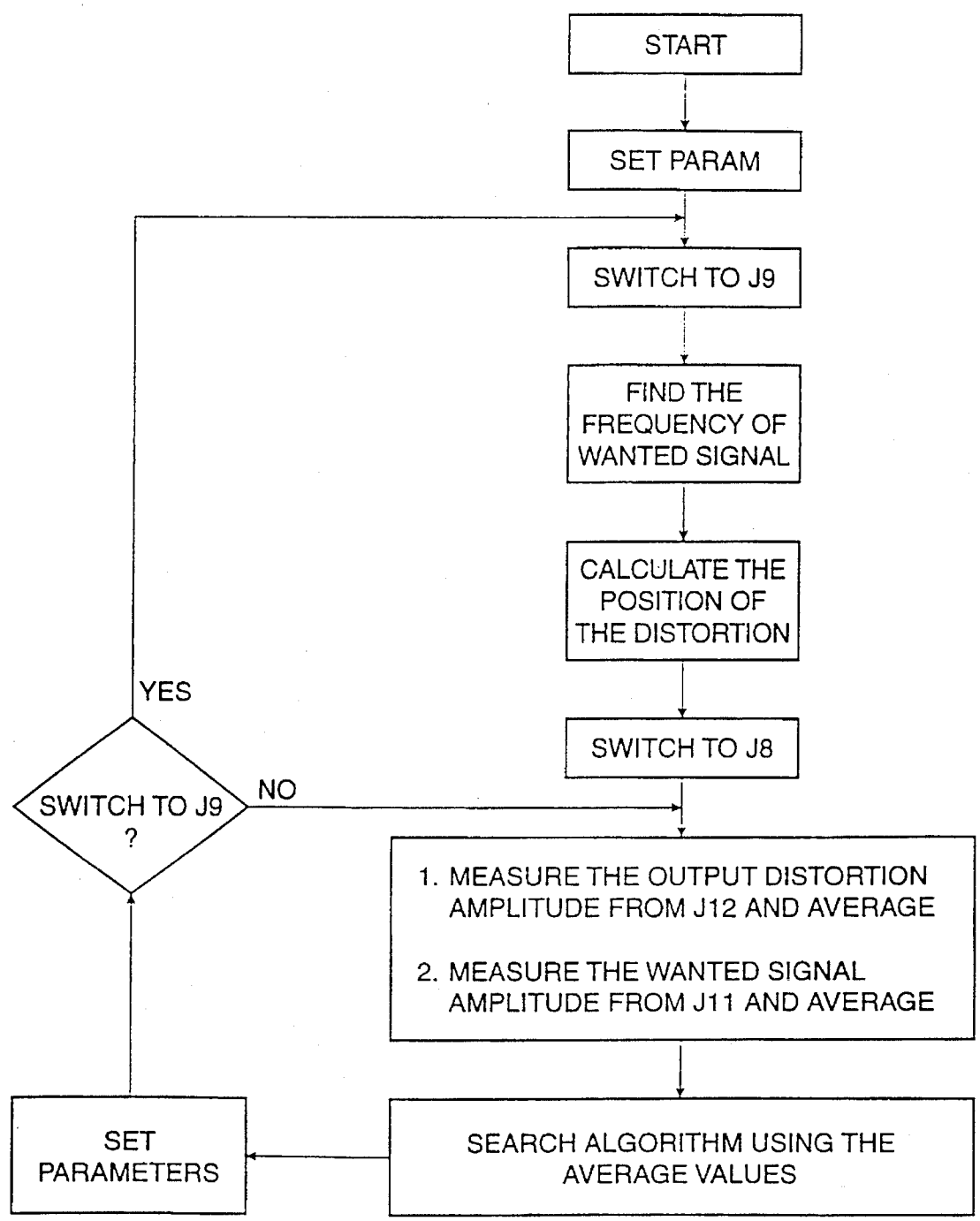
FIG. 13 is a flow chart of an algorithm used to produce an averaged sample signal value using a targeted channel sampling method.

Similarly, FIG. 13 shows an algorithm for use with targeted channel sampling methods of the present invention. Instead of using the largest amplitude signals at the channel frequency locations identified to generate the control signals, the amplitude of all signals at the identified location are measured and averaged. These average values for wanted signals and distortion signals are then used by the search algorithm which acts to create the equalizer control signals.

Sample signal averaging features the distinct advantage of being able to effectively control multiple distortion products. By using single sample signals on the basis of amplitude, for example, to generate equalizer control signals, the result is that a particular distortion product is controlled, but other ramifications may occur. Correcting a single distortion product may cause another to increase in amplitude, for instance. By correcting a range of distortion products by using averaged sample signals, system efficiency and speed may be greatly improved.

Another way to improve overall amplifier system performance in the present invention is rather than averaging sample signals, each sample signal amplitude is measured and assigned a weighted value. These weighted values are then used by the search algorithm to generate the appropriate equalizer control signals.

CALIBRATION

The present invention also includes a mechanism to perform automatic and/or periodic self-calibrations. Such calibrations overcome problems associated with changes in overall system tolerances.

Each component of the analog portion of an amplifier system is subject to different tolerances, due in part to imperfections between components, and between component batches used during manufacture or repair. The net analog system tolerance for each manufactured system must meet certain minimum standards. Therefore, it's not uncommon for a relatively large percentage of manufactured systems to be rejected on this basis.

Furthermore, the tolerances of such analog components change over time in response to their age and environmental conditions. Components exceeding a certain pre-determined tolerance specification must be replaced, a costly part of overall system maintenance and upkeep.

The net result of the analog portion of an amplifier system being out of tolerance is that certain characteristics (e.g., amplitude) of the signals, such as those for injected pilot signals that are used by the system to generate control signals may vary widely, thus introducing error into control signal calculations and decreasing overall system performance.

Amplification systems are needed, including systems with the adaptive controller of the present invention, that can automatically characterize their analog portion, meaning quantify the overall tolerance of their analog system, and use this information to optimize system performance and refine still further the accuracy and applicability of amplifier control signals.

Figure 14:
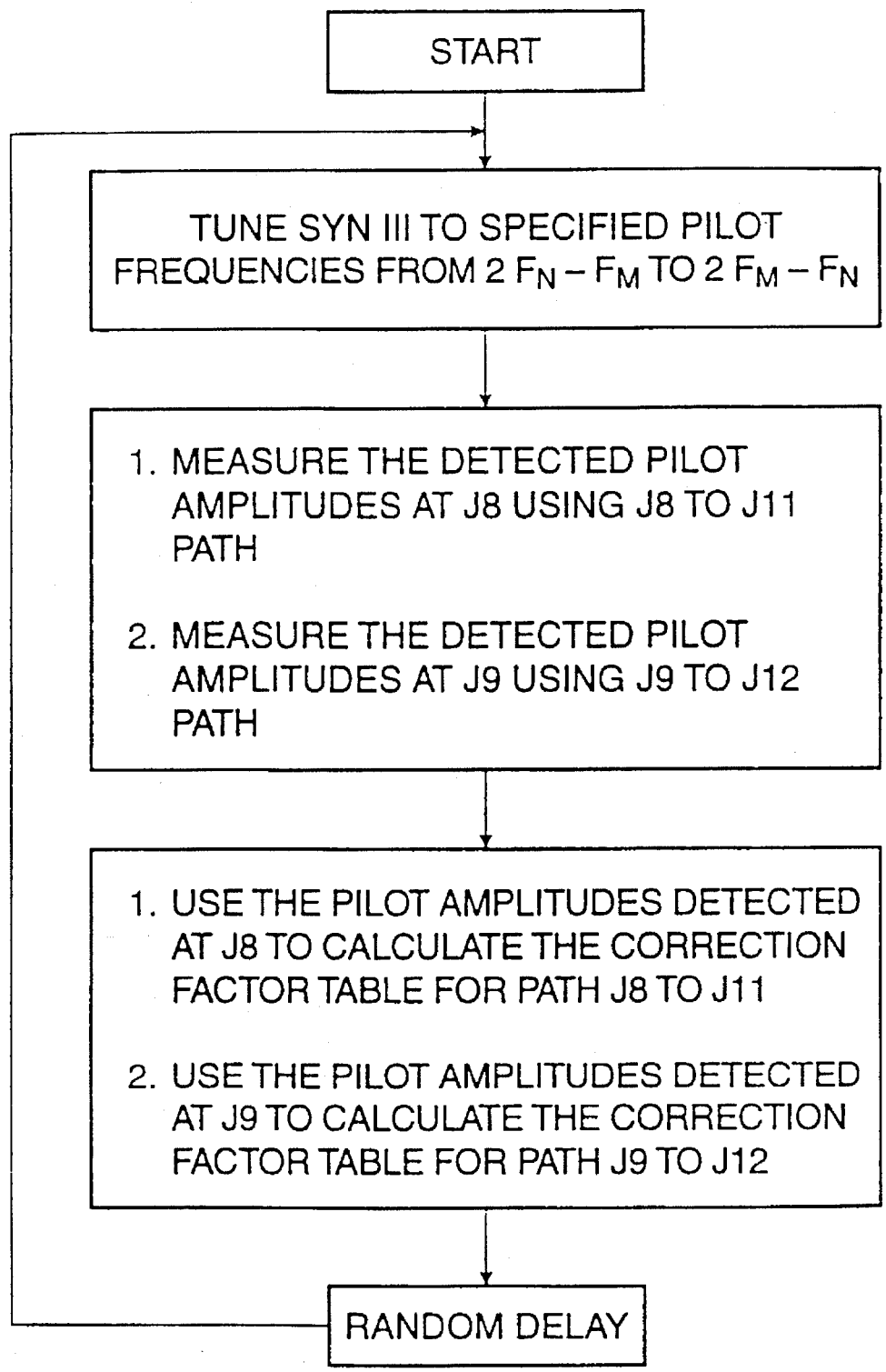
FIG. 14 is a flow chart showing procedure used to automatically and periodically calibrate amplifier systems.

In a preferred embodiment of the present invention shown in FIG. 14, synthesizer (SYN) 201 is tuned to a number of specific frequencies, across the band of interest, in order to generate broad band pilot signals of equivalent amplitude which are then injected at combiner 104 (referring to FIG. 1). The amplitude of the pilot signals are detected and measured at JS, using the J8 to J11 signal path. The amplitude of the pilot signals are also detected and measured at J9, using the J9 to J12 signal path. The result of the two pilot signal's amplitudes is used to calculate a correction factor lookup table for path J8 to J11 and a similar lookup table for path J9 to J12. The lookup table is constructed by DSP 310 and resides in memory 311 until being applied by DSP 310 to the estimation algorithms, prior to the calculation of the equalizer control signals.

It should be noted that this calibration process may be accomplished during the final phases of manufacturing systems that use the present invention. In addition, this calibration process may be performed at pre-selected or random intervals automatically, as is indicated by the random delay in FIG. 14. Calibration, carried out according to the present invention and during system operation, may proceed in two ways in order that interference with desired carrier signals is avoided. In one instance, synthesizer 201 can be a very rapid signal generator, such that the broad band pilot signal it creates and injects into the system produces only so called "impulsive interference" which in many applications is not noticeable or detrimental to system performance. Alternatively, automatic self-calibration may be conducted incrementally, say on a channel-by-channel basis, where such channels are not in use. In this case, the system's ability to identify the location of desired, in-band signals is used to temporarily avoid calibration operations in those channels. Over a relatively short period of time, these incremental calibrations will naturally combine to form a complete and usable system calibration.

Finally, it should be noted that such a calibration system as the one described here has the added advantage of increasing amplifier system production yields. Overall system tolerances can be automatically equalized on an operational basis, system by system, meaning more produced systems will meet basic tolerance specifications. Another way of considering the calibration system of the present invention is one that produces an operating system configured to handle an unusually broad range of analog component tolerances.

OTHER FEATURES

Figure 15:
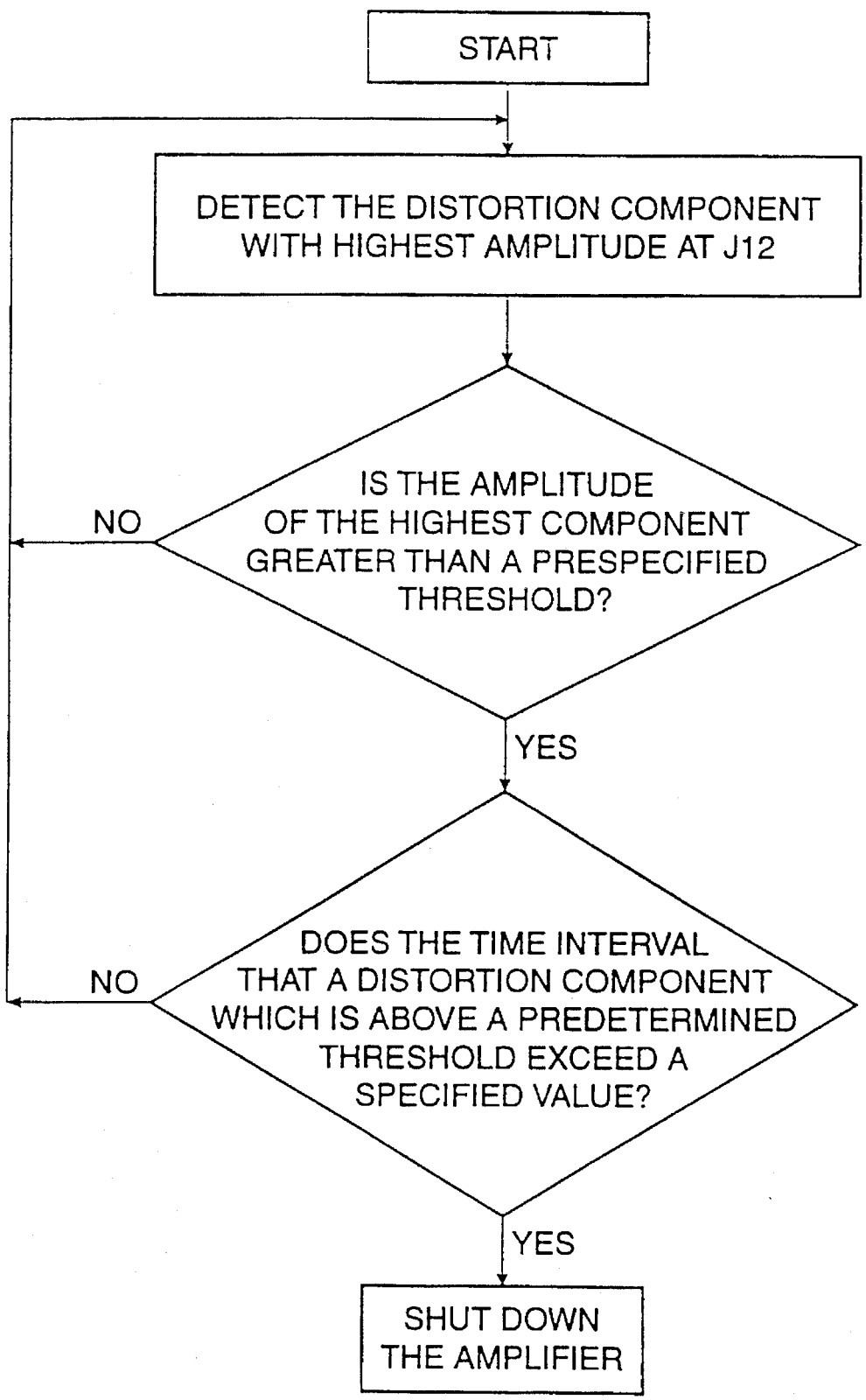
FIG. 15 is a flow chart showing procedure used to generate an alarm.

The various embodiments of the present invention can also employ an alarm generation function, shown in FIG. 15, which will effectively shut the amplifier system down if a distortion component exceeds a pre-specified value over a certain period of time.

The invention has been described with reference to several illustrative embodiments. It will be apparent to one skilled in the art, however, that various modifications can be made without departing from the spirit and scope of the invention. For example, FIG. 5 depicts a feed-forward amplifier system with separate attenuator and phase shifters. It will be appreciated by those of skill in the art that these two components could be combined into a single fabricated unit. In addition, an in-band pilot signal could be used for sampling purposes by the adaptive controller, provided no wanted signal or carrier was operating at the same frequency. It will similarly be appreciated by those of skill in the art that the feed-forward amplifier systems described here could include multiple distortion (error) amplifier (cancellation) loops.

What is claimed is:

1. In connection with a feed-forward linear amplifier having a main amplification path and a distortion signal path, said distortion signal path including means for controlling distortion signal delay and means for controlling distortion signal attenuation, an adaptive controller system for use in minimizing signal distortion of information signals applied through said linear amplifier, said adaptive controller system comprising:

means for continuously sampling analog signal output of said linear amplifier to produce an analog sampled signal;

means for downconverting said analog sampled signal to an IF band as a first analog IF signal;

first analog to digital converter means coupled to said downconverting means to convert said first analog IF signal to a first digitized IF signal;

means coupled to receive said first digitized IF signal for DSP processing said digitized IF signal to downconvert said digitized IF signal to a digitized baseband signal, to produce an in-phase component signal and a quadrature-phase component signal, and to generate from said in-phase component signal and said quadrature-phase component signal at least one error correction signal; and means for applying said at least one error correction signal to said distortion signal delay controlling means and to said distortion signal attenuation controlling means for control in cancelling distortion in the information signal output of said linear amplifier.

2. The adaptive controller system according to claim 1, wherein said digitized IF signal is digitally sampled at a subharmonic of said IF signal.

3. The adaptive controller system according to claim 1, further including means for injecting a pilot signal into said information signal of said linear amplifier, and wherein said downconverting means is tuned to a frequency of said pilot signal to pass said pilot signal within a passband of said downconverting means.

4. The adaptive controller system according to claim 1, wherein said linear amplifier is a multi-channel amplifier, and wherein said downconverting means includes means for tuning across a range of channels for sampling on a channel-by-channel basis.

5. The adaptive controller system according to claim 1, wherein said linear amplifier is a multichannel amplifier, and wherein said downconverting means includes means for tuning to a limited selection of channels for sampling on a targeted channel basis.

6. The adaptive controller system according to claim 5, wherein said downconverting means includes a first mixer means in a first signal path coupled to said first analog to digital converter means, a second mixer means on a second signal path for generating a second analog IF signal;

further including a second analog to digital converter means coupled to said downconverting means to convert said second analog IF signal to a second digitized IF signal; and switch means for selectively alternatively applying a representation of said analog sampled signal to said second mixer means along said second signal path and a representation of a distortion signal of said linear amplifier to said second mixer means along said second signal path for finding targeted channels and for generating a distortion sample signal for use in controlling phase delay and attenuation in said main amplification path.

7. The adaptive controller system according to claim 1, wherein said downconverting means includes a first mixer means in a first signal path coupled to said first analog to digital converter means, a second mixer means on a second signal path for generating a second analog IF signal;

further including a second analog to digital converter means coupled to said downconverting means to convert said second analog IF signal to a second digitized IF signal for continuously applying a representation of a distortion signal of said linear amplifier to said second mixer means along said second signal path for generating a distortion sample signal for use in controlling phase delay and attenuation in said main amplification path.

8. The apparatus according to claim 4 wherein said DSP processing means further includes means for producing a final error correction signal from averaging of measurements of said error correction signal on all channels to apply to said distortion signal delay means and said distortion signal attenuation means.

9. The apparatus according to claim 5 wherein said DSP processing means further includes means for producing a final error correction signal from averaging of measurements of said error correction signal on said targeted channels to apply to said distortion signal delay means and said distortion signal attenuation means.

10. The apparatus according to claim 6 wherein said DSP processing means further includes means for producing a final error correction signal from averaging of measurements of said error correction signal based on said pilot to apply to said distortion signal delay means and said distortion signal attenuation means.

11. The apparatus according to claim 4 wherein said DSP processing means further includes means for producing a final error correction signal from measurements of maxima of said error correction signal on all channels to apply to said distortion signal delay means and said distortion signal attenuation means.

12. The apparatus according to claim 5 wherein said DSP processing means further includes means for producing a final error correction signal from measurements maxima of said error correction signal on said targeted channels to apply to said distortion signal delay means and said distortion signal attenuation means.

13. The apparatus according to claim 6 wherein said DSP processing means further includes means for producing a final error correction signal from measurements of maxima of said error correction signal based on said pilot to apply to said distortion signal delay means and said distortion signal attenuation means.

14. In connection with a feed-forward linear amplifier having a main amplification path and a distortion signal path, said distortion signal path including means for controlling distortion signal delay and means controlling distortion signal attenuation, a method for adaptive control of said linear amplifier to minimize signal distortion of information signals applied through said linear amplifier, comprising the steps of:

continuously sampling analog signal output of said linear amplifier to produce an analog sampled signal;

downconverting said analog sampled signal to an IF band as a first analog IF signal;

converting said first analog IF signal to a first digitized IF signal;

downconverting said digitized IF signal to a digitized baseband signal, to produce an in-phase component signal and a quadrature-phase component signal, and to generate from said in-phase component signal and said quadrature-phase component signal at least one error correction signal; and applying said at least one error correction signal to a distortion signal delay controlling means and to a distortion signal attenuation controlling means for control in cancelling distortion in the information signal output of said linear amplifier.

15. The method according to claim 14, wherein said digitized IF signal is digitally sampled at a subharmonic of said IF signal.

16. The method according to claim 14, further including the steps of injecting a pilot signal into said information signal of said linear amplifier, and of tuning said downconverting means to a frequency of said pilot signal to pass said pilot signal within a passband of said downconverting means.

17. The method according to claim 14, wherein said linear amplifier is a multichannel amplifier, further including the step of tuning said downconverting means across a range of channels for sampling on a channel-by-channel basis.

18. The method according to claim 14, wherein said linear amplifier is a multichannel amplifier, further including the step of tuning said downconverting means to a limited selection of channels for sampling on a targeted channel basis.

19. The method according to claim 18, wherein said downconverting step includes the step of mixing signals in a first signal path and mixing signal in a second signal path for generating a second analog IF signal;

converting said second analog IF signal to a second digitized IF signal; and selectively alternatively applying a representation of said analog sampled signal for said mixing along said second signal path and a representation of a distortion signal of said linear amplifier for mixing along said second signal path for finding targeted channels and for generating a distortion sample signal for use in controlling phase delay and attenuation in said main amplification path.

20. The method according to claim 14, wherein said downconverting step includes mixing signals in a first signal path for generating said first analog IF signal and mixing signals in a second signal path for generating a second analog IF signal;

converting said second analog IF signal to a second digitized IF signal for continuously applying a representation of a distortion signal of said linear amplifier to said second mixer means along said second signal path for generating a distortion sample signal for use in controlling phase delay and attenuation in said main amplification path.

21. The method according to claim 17 wherein said DSP processing further includes producing a final error correction signal from averaging of measurements of said error correction signal on all channels to apply to said distortion signal delay means and said distortion signal attenuation means.

22. The method according to claim 18 wherein said DSP processing further includes producing a final error correction signal from averaging of measurements of said error correction signal on said targeted channels to apply to said distortion signal delay means and said distortion signal attenuation means.

23. The method according to claim 19 wherein said DSP processing further includes producing a final error correction signal from averaging of measurements of said error correction signal based on said pilot to apply to said distortion signal delay means and said distortion signal attenuation means.

24. The method according to claim 17 wherein said DSP processing further includes producing a final error correction signal from measurements of maxima of said error correction signal on all channels to apply to said distortion signal delay means and said distortion signal attenuation means.

25. The method according to claim 18 wherein said DSP processing further includes producing a final error correction signal from measurements maxima of said error correction signal on said targeted channels to apply to said distortion signal delay means and said distortion signal attenuation means.

26. The method according to claim 19 wherein said DSP processing further includes producing a final error correction signal from measurements of maxima of said error correction signal based on said pilot to apply to said distortion signal delay means and said distortion signal attenuation means.

27. In connection with a feed-forward linear amplifier having a main amplification signal path and a distortion signal path according to claim 1, said main amplification signal path including means for controlling main signal delay and means for controlling main signal attenuation, an adaptive controller system for use in extracting from a representation of said main amplification signal path a substantially pure distortion signal for application to said distortion signal path, said adaptive controller system comprising:

means for continuously sampling analog signal output of said linear amplifier to produce an output analog sampled signal;

means for subtracting said output analog sampled signal from a representation of an input signal to said feed-forward linear amplifier to produce said distortion signal;

means for sampling said distortion signal to produce a continuously-sampled distortion signal;

means coupled to receive said continuously-sampled distortion signal for downconverting said continuously-sampled distortion signal to an IF band as a second analog IF signal;

second analog to digital converter means coupled to said downconverting means to convert said second analog IF signal to a second digitized IF signal;

means coupled to receive said second digitized IF signal for DSP processing said second digitized IF signal to downconvert said second digitized IF signal to a second digitized baseband signal, to produce a distortion in-phase component signal and a distortion quadrature-phase component signal, and to generate from said distortion in-phase component signal and said distortion quadrature-phase component signal at least one distortion error correction signal; and means for applying said at least one distortion error correction signal to said main signal delay controlling means and to said main signal attenuation controlling means for control in cancelling information signal output in said distortion signal path to yield said substantially pure distortion signal.

28. In connection with a feed-forward linear amplifier having a main amplification signal path and a distortion signal path, said main amplification signal path including means for controlling main signal delay and means for controlling main signal attenuation, an adaptive controller system for use in extracting from a representation of said main amplification signal path a substantially pure distortion signal for application to said distortion signal path, said adaptive controller system comprising:

means for continuously sampling analog signal output of said linear amplifier to produce an output analog sampled signal;

means for subtracting said output analog sampled signal from a representation of an input signal to said feed-forward linear amplifier to produce said distortion signal;

means for sampling said distortion signal to produce a continuously-sampled distortion signal;

means coupled to receive said continuously-sampled distortion signal for downconverting said continuously-sampled distortion signal to an IF band as a second analog IF signal;

second analog to digital converter means coupled to said downconverting means to convert said second analog IF signal to a second digitized IF signal;

means coupled to receive said second digitized IF signal for DSP processing said second digitized IF signal to downconvert said second digitized IF signal to a second digitized baseband signal, to produce a distortion in-phase component signal and a distortion quadrature-phase component signal, and to generate from said distortion in-phase component signal and said distortion quadrature-phase component signal at least one distortion error correction signal; and means for applying said at least one distortion error correction signal to said main signal delay controlling means and to said main signal attenuation controlling means for control in cancelling information signal output in said distortion signal path to yield said substantially pure distortion signal.

29. In connection with a feed-forward linear amplifier having a main amplification signal path and a distortion signal path, said main amplification signal path including means for controlling main signal delay and means for controlling main signal attenuation, a method for extracting from a representation of said main amplification signal path a substantially pure distortion signal for application to said distortion signal path, said method comprising the steps of:

continuously sampling analog signal output of said linear amplifier to produce an output analog sampled signal;

subtracting said output analog sampled signal from a representation of an input signal to said feed-forward linear amplifier to produce said distortion signal;

sampling said distortion signal to produce a continuously-sampled distortion signal;

downconverting said continuously-sampled distortion signal to an IF band as a second analog IF signal;

converting said second analog IF signal to a second digitized IF signal;

DSP processing said second digitized IF signal to downconvert said second digitized IF signal to a second digitized baseband signal, to produce a distortion in-phase component signal and a distortion quadrature-phase component signal, and to generate from said distortion in-phase component signal and said distortion quadrature-phase component signal at least one distortion error correction signal; and applying said at least one distortion error correction signal to control delay in said main signal path and to control attenuation in said main signal path in order to control cancelling of information signal output in said distortion signal path to yield said substantially pure distortion signal.

\* \* \* \* \*